(12) United States Patent
Lin

(10) Patent No.: US 10,305,480 B2
(45) Date of Patent: May 28, 2019

(54) VOLTAGE GENERATING CIRCUIT AND ESD PROTECTING METHOD

(71) Applicant: MEDIATEK INC., Hsin-Chu (TW)

(72) Inventor: Wen-Yi Lin, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 291 days.

(21) Appl. No.: 15/275,482

(22) Filed: Sep. 26, 2016

(65) Prior Publication Data

US 2017/0170830 A1 Jun. 15, 2017

Related U.S. Application Data

(60) Provisional application No. 62/264,946, filed on Dec. 9, 2015.

(51) Int. Cl.
*H01L 27/02* (2006.01)
*H03K 19/003* (2006.01)
*H03K 19/0185* (2006.01)

(52) U.S. Cl.
CPC ... *H03K 19/00361* (2013.01); *H01L 27/0266* (2013.01); *H03K 19/018521* (2013.01)

(58) Field of Classification Search
CPC ............. H03K 3/013; H03K 19/00361; H03K 19/018521; H01L 27/0266
USPC .......................................................... 361/56
See application file for complete search history.

(56) References Cited

U.S. PATENT DOCUMENTS

2006/0262472 A1* 11/2006 Okushima ........... H01L 27/0251
361/91.1
2009/0097174 A1* 4/2009 Ker ..................... H01L 27/0266
361/56

FOREIGN PATENT DOCUMENTS

CN        1866522 A     11/2006
TW       200917453       4/2009

* cited by examiner

*Primary Examiner* — Kevin J Comber
(74) *Attorney, Agent, or Firm* — Winston Hsu

(57) ABSTRACT

A voltage generating circuit comprising: a first switch circuit, operating in a first power domain; a second switch circuit, operating in a second power domain; a first transistor of first type, comprising a control terminal coupled to the first switch circuit and the second first switch circuit, wherein the control terminal of the first transistor of first type is coupled to a predetermined voltage source via the first switch circuit if the first switch circuit is active, wherein the control terminal of the first transistor of first type is coupled to the predetermined voltage source via the second switch circuit if the second switch circuit is active; and an output circuit, coupled to the first transistor of first type and operating in the second power domain.

14 Claims, 6 Drawing Sheets

VOLTAGE GENERATING CIRCUIT AND ESD PROTECTING METHOD

CROSS REFERENCE TO RELATED APPLICATIONS

This application claims the benefit of U.S. Provisional Application No. 62/264,946, filed on Dec. 9, 2015, the contents of which are incorporated herein by reference.

BACKGROUND

Conventionally, a level shifter always comprises a GGN-MOS (gate-grounded NMOS)for ESD (Electrostatic discharge) protection. Specifically, the GGMOS has a parasitic BJT therein, such that the ESD current can be leaked to a ground via the parasitic BJT. However, the parasitic BJT does not work well if the GGNMOS is made by a 3D process such as a FinFET process.

Therefore, another solution is to provide a switch circuit (or named a tie-low circuit) coupled to a gate terminal of the GGNMOS. However, such structure has some defects. One of which is that the gate terminal of the GGNMOS may receive a floating voltage caused by other sources while the switch circuit is non-active. Such floating voltage may turn on the GGNMOS thus causes un-desired leakage currents.

SUMMARY

Therefore, one objective of the present application is to provide a voltage generating circuit which can reduce the leakage currents.

Another objective of the present application is to provide a voltage generating circuit which can reduce the leakage currents.

One embodiment of the present application discloses a voltage generating circuit, comprising: a first switch circuit, coupled between a first supply voltage source and a predetermined voltage source; a second switch circuit, coupled between a second supply voltage source and the predetermined voltage source; a first transistor of first type, comprising a control terminal coupled to the first switch circuit and the second first switch circuit, wherein the control terminal of the first transistor of first type is coupled to the predetermined voltage source via the first switch circuit if the first switch circuit is active, and the control terminal of the first transistor of first type is coupled to the predetermined voltage source via the second switch circuit if the second switch circuit is active; and an output circuit, coupled between the second supply voltage source and the predetermined voltage source, and coupled to the first transistor of first type.

Another embodiment of the present application discloses a voltage generating circuit comprising: a first switch circuit, operating in a first power domain; a second switch circuit, operating in a second power domain; a first transistor of first type, comprising a control terminal coupled to the first switch circuit and the second first switch circuit, wherein the control terminal of the first transistor of first type is coupled to a predetermined voltage source via the first switch circuit if the first switch circuit is active, wherein the control terminal of the first transistor of first type is coupled to the predetermined voltage source via the second switch circuit if the second switch circuit is active; and an output circuit, coupled to the first transistor of first type and operating in the second power domain.

Another embodiment of the present application discloses an ESD protecting method, applied to a voltage generating circuit comprising a first switch circuit, a second switch circuit, a first transistor of first type and an output circuit coupled to the first transistor of first type. The first switch circuit and the second switch circuit operate in different power domains. The ESD protecting method comprises: controlling the first switch circuit to operate in a first power domain; controlling the second switch circuit and the output circuit to operate in a second power domain; coupling a control terminal of the first transistor of first type to a predetermined voltage source via the first switch circuit if the first switch circuit is active; and coupling a control terminal of the first transistor of first type to the predetermined voltage source via the second switch circuit if the second switch circuit is active.

In view of above-mentioned embodiments, the issue of leakage currents can be avoided since switch circuits applying two different power domains are provided.

These and other objectives of the present application will no doubt become obvious to those of ordinary skill in the art after reading the following detailed description of the preferred embodiment that is illustrated in the various figures and drawings.

DETAILED DESCRIPTION

Figure 1:
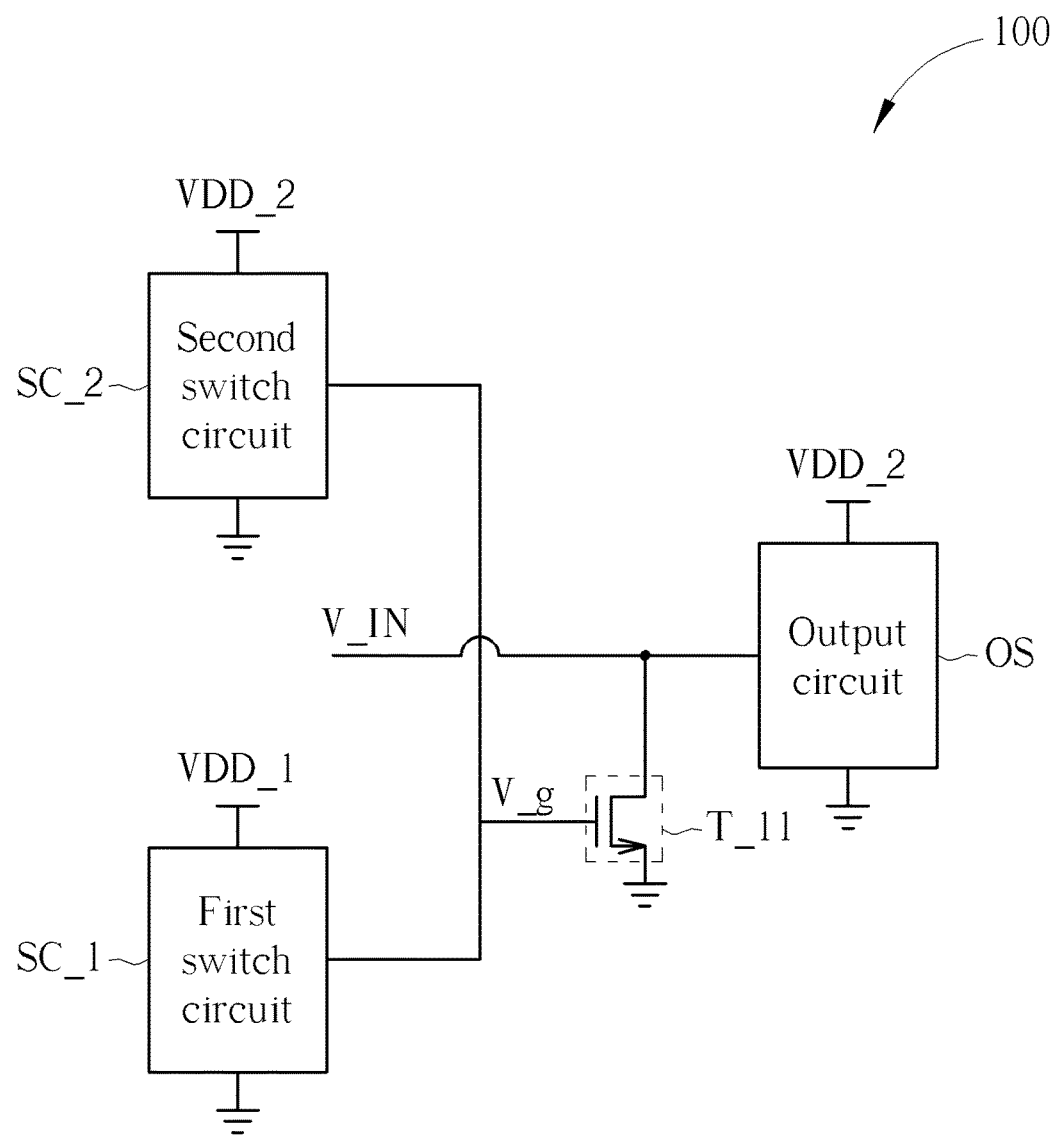
FIG. 1 is a block diagram illustrating a voltage generating circuit according to one embodiment of the present application.

FIG. 1 is a block diagram illustrating a voltage generating circuit 100 according to one embodiment of the present application. As illustrated in FIG. 1, the voltage generating circuit 100 comprises: a first switch circuit SC_1, a second switch circuit SC_2, a first transistor of first type T_11, and an output circuit OS. The voltage generating circuit 100 can be, for example, part of a level shifter, but not limited.

The first switch circuit SC_1 comprises: a first terminal which will be describe later, a second terminal coupled to a first supply voltage source VDD_1, and a third terminal coupled to a ground (i.e. a predetermined voltage source). The second switch circuit SC_2 comprises: a first terminal which will be describe later, a second terminal coupled to a second supply voltage source VDD_2, and a third terminal coupled to the ground.

The first transistor of first type T_11 comprises a first terminal which will be describe later, a second terminal coupled to the ground, and a control terminal coupled to the first terminal of the first switch circuit SC_1 and the first terminal of the second first switch circuit SC_2. The output circuit OS comprises a first terminal coupled to the second supply voltage source VDD_2, a second terminal coupled to the ground, and a third terminal coupled to the first terminal of the first transistor of first type T_11. The input voltage V_IN indicates a voltage provided by other sources (ex. other circuits), which will be described later.

The control terminal of the first transistor of first type T_11 is coupled to the ground via the first switch circuit SC_1 if the first switch circuit SC_1 is active. Similarly, the control terminal of the first transistor of first type T_11 is coupled to the ground via the second switch circuit SC_2 if the second switch circuit SC_2 is active. the Also, if an ESD event occurs (i.e. the input voltage V_IN has a pulse) while the first switch circuit SC_1 or the second switch circuit SC_2 is active, the first switch circuit SC_1 or the second switch circuit SC_2 turns on the first transistor of first type T_11, such the first transistor of first type T_11 can leak the ESD current to the ground. Besides, the first switch circuit SC_1 or the second switch circuit SC_2 can also leak some ESD current to the ground.

In one embodiment, if one of the first switch circuit SC_1 and the second switch circuit SC_2 is active, the other one of the first switch circuit SC_1 and the second switch circuit SC_2 is non-active.

Please note the first switch circuit SC_1 operates in a power domain between the first supply voltage VDD_1 and the predetermined voltage. Also, the second switch circuit SC_2 and the output circuit OS operates in a power domain between the second supply voltage VDD_2 and the predetermined voltage. Accordingly, the first switch circuit SC_1 can be regarded as operating in a first power domain, and the second switch circuit SC_2, the output circuit OS can be regarded as operating in a second power domain different from the first power domain.

Figure 2A:
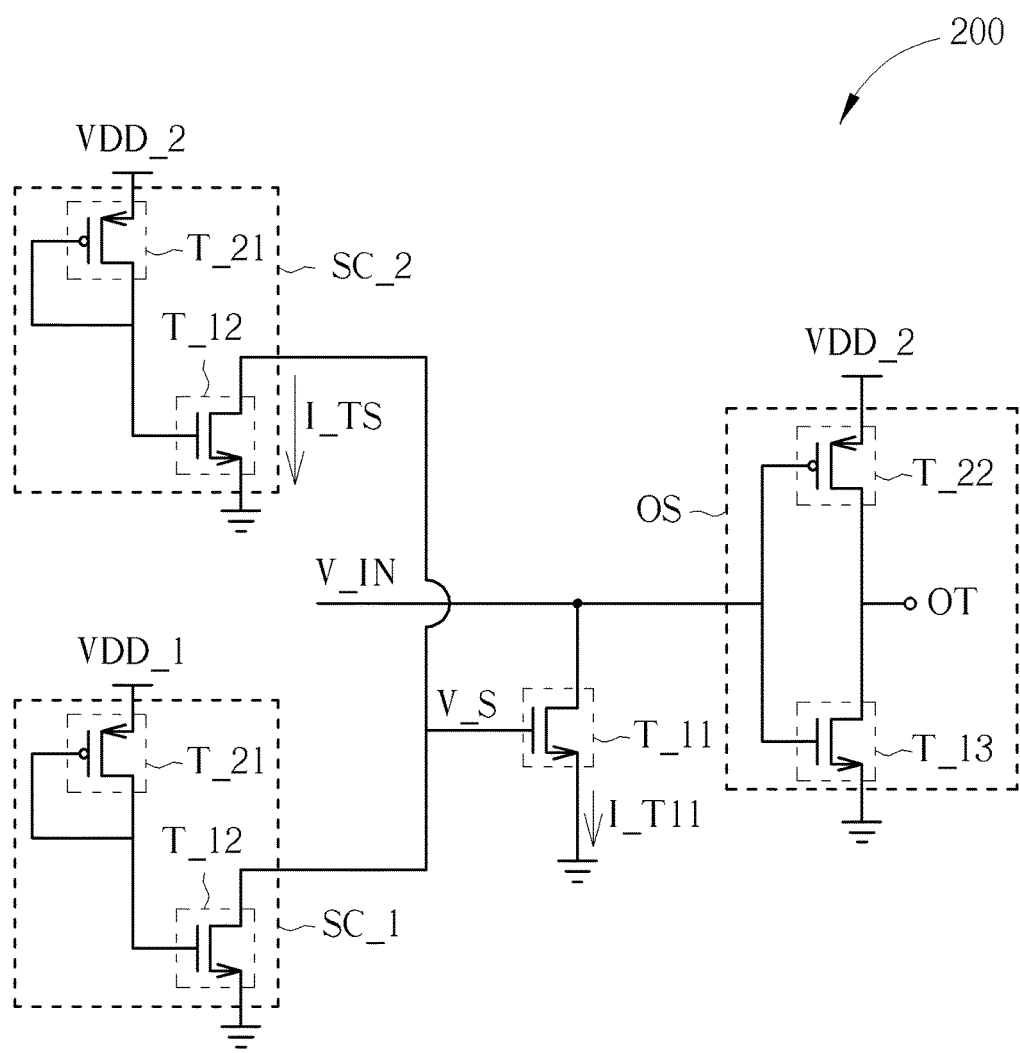
FIG. 2A and FIG. 2B are circuit diagrams illustrating detail circuit structures for the voltage generating circuit illustrated in FIG. 1.

FIG. 2A is a circuit diagram illustrating a detail circuit structure for the voltage generating circuit illustrated in FIG. 1. Please note the voltage generating circuit 200 illustrated in FIG. 2A is only for example and does not mean to limit the scope of the present application.

As illustrated in FIG. 2A, the first switch circuit SC_1 comprises a first transistor of second type T_21 and a second transistor of first type T_12. The first transistor of second type T_21 comprises: a first terminal coupled to the first supply voltage source VDD_1, a control terminal, and a second terminal coupled to the control terminal. Also, the second transistor of first type T_12 comprises a first terminal coupled to the control terminal of the first transistor of first type T_11, a second terminal coupled to the ground, and a control terminal coupled to the second terminal of the first transistor of second type T_21. The first transistor of second type T_21 and a second transistor of first type T_12 are turned on while the first switch circuit SC_1 is active. By this way, the control terminal of the second transistor of first type T_12 is biased by the first transistor of second type T_21 such that the second transistor of first type T_12 is turned on. On the opposite, the second transistor of first type T_12 and/or the first transistor of second type T_21 are turned off while the first switch circuit SC_1 is non-active.

Besides, in this embodiment, the circuit structure of the second switch circuit SC_2 is the same as which of the first switch circuit SC_1, thus descriptions thereof are omitted for brevity here. However, it is not limited that the first switch circuit SC_1 and the second switch circuit SC_2 have identical circuit structures.

Additionally, the output circuit OS comprises a second transistor of second type T_22 and a second transistor of second type T_12, and can output an output signal at the output terminal OT according to the signal received at the control terminals of the second transistor of second type T_22 and the second transistor of second type T_12. The second transistor of second type T_22 comprises: a first terminal coupled to the second supply voltage source VDD_2, a control terminal coupled to the first terminal of the first transistor of first type T_11, and a second terminal coupled to the output terminal OT. Also, the third transistor of first type T_13 comprises a first terminal coupled to the second terminal of the second transistor of second type T_22, a second terminal coupled to the ground, and a control terminal coupled to the first terminal of the first transistor of first type T_11.

In one embodiment, the first transistor of first type T_11, the second transistor of first type T_12, and the third transistor of first type T_13 are N type MOSFETs. Also, the first transistor of second type T_21, and the second transistor of second type T_22 are P type MOSFETs. The arrangement for terminals of the transistors of first type and terminals of the transistors of second type are clearly illustrated in FIG. 2A, thus descriptions thereof are omitted for brevity here.

Figure 2B:
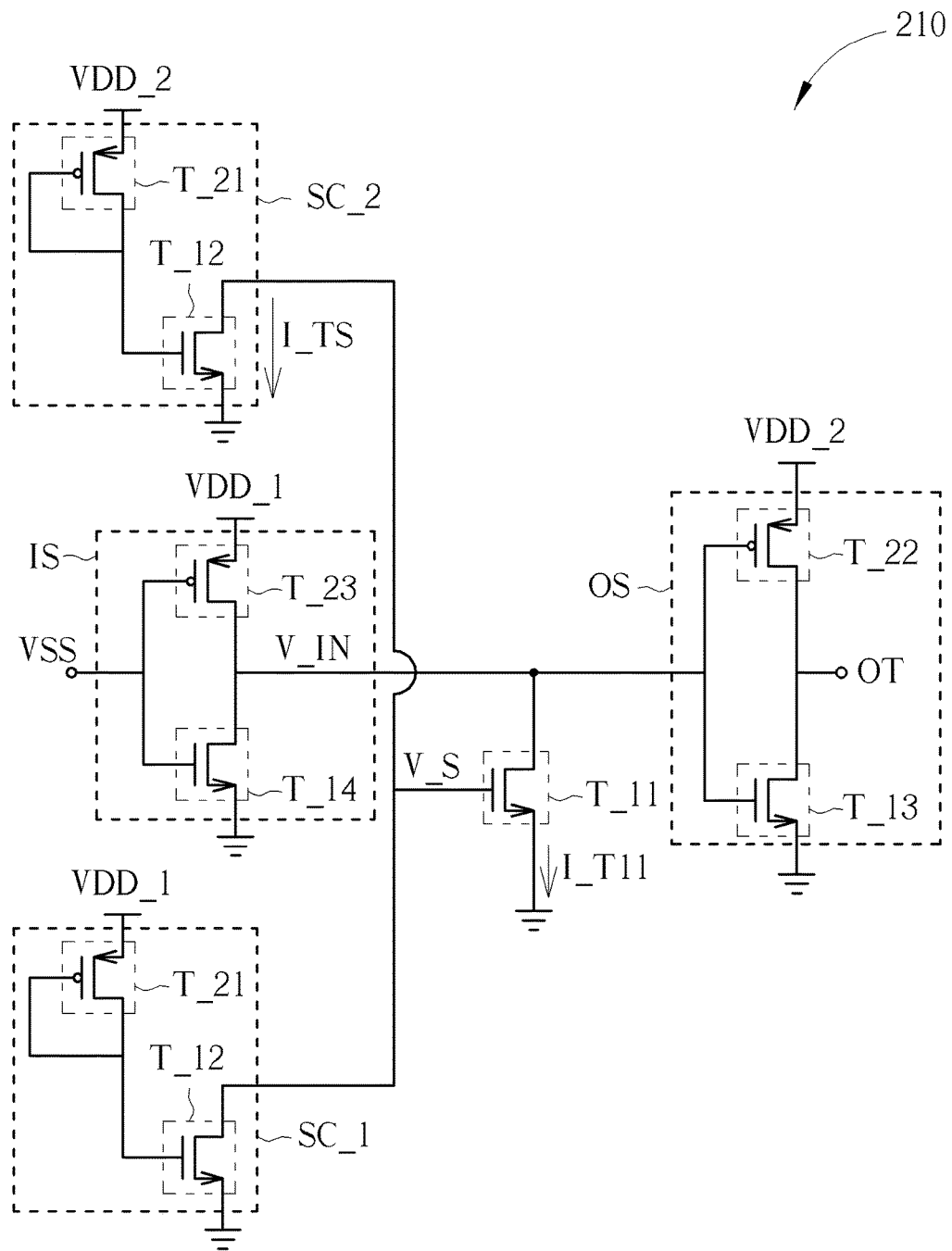

The above-mentioned input voltage V_IN can come from various kinds of voltage sources. In one embodiment, the input voltage V_IN is generated based on the first supply voltage source VDD_1, that is, the circuit generating the input voltage V_IN operates in the first power domain. FIG. 2B illustrates an example for the circuit which generates the input voltage V_IN. As illustrated in FIG. 2B, the input voltage V_IN is generated by an input circuit IS operating in the first power domain.

More specifically, the input circuit IS comprises a third transistor of second type T_23 and a fourth transistor of first type T_14. The third transistor of second type T_23 comprises a first terminal coupled to the first supply voltage source VDD_1, a second terminal outputting the input voltage V_IN, and a control terminal receiving a predetermined voltage VSS. The fourth transistor of first type T_14 comprises a first terminal coupled to the second terminal of the third transistor of second type T_23, a second terminal coupled to the ground, and a control terminal receiving the predetermined voltage VSS.

Please note the input voltage V_IN is not limited to be generated by the input circuit IS illustrated in FIG. 2B. Also, the input circuit IS illustrated in FIG. 2B is not limited to be applied to the voltage generating circuit 210 illustrated in FIG. 2B.

Moreover, in some embodiments, the second transistor of second type T_22 and the third transistor of first type T_13 can work as an inverter, and so do the third transistor of second type T_23 and the fourth transistor of first type T_14. However, the third transistor of second type T_23, the second transistor of second type T_22, the fourth transistor of first type T_14 and the third transistor of first type T_13 are just for illustration, but not limited. It means that the third transistor of second type T_23 and the second transistor of second type T_22 can be implemented by other types of pull up circuits, and the fourth transistor of first type transistor T_14 and the third transistor of first type T_13 can be implemented by other types of pull down circuits.

Figure 3:
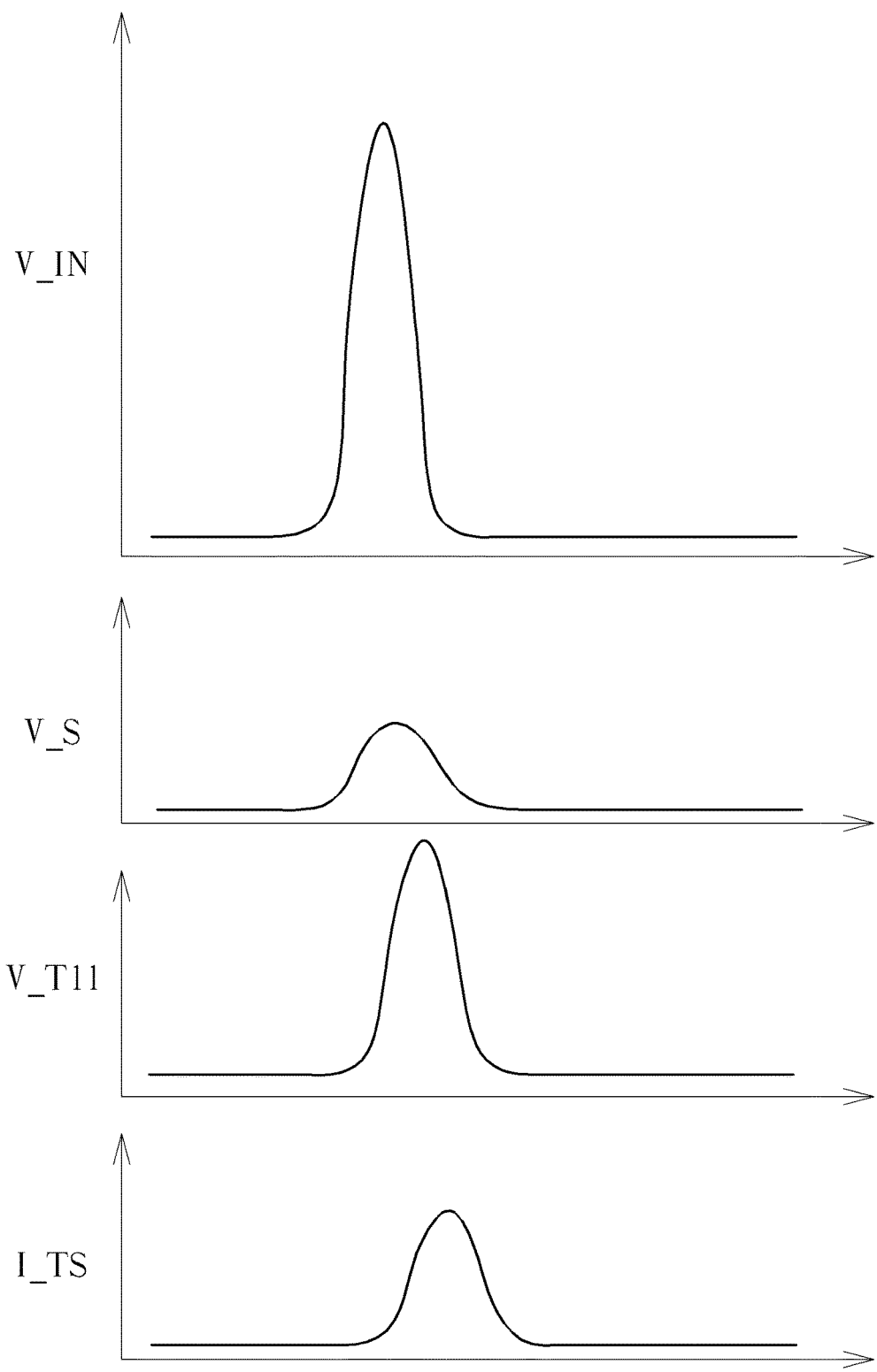
FIG. 3 and FIG. 4 are schematic diagrams illustrating operations for the voltage generating circuit illustrated in FIG. 2A.

FIG. 3 is a schematic diagram illustrating operations for the voltage generating circuit illustrated in FIG. 2A. In this embodiment, the first switch circuit SC_1 is non-active and the second switch circuit SC_2 is active. As illustrated in FIG. 3, if an ESD event occurs, the input voltage V_IN has a pulse. The switch voltage V_S also raises up following the input voltage V_IN since the first terminal of the second transistor of first type T_12 is coupled to the first terminal of the first transistor of first type T_11 via parasitic capacitance of the first transistor of first type T_11. Accordingly, the first transistor of first type T_11 is turned on by the switch voltage V_S, such that the first transistor of first type T_11 leaks the ESD current I_T11 to the ground. Additionally, the second transistor of first type T_12 also leaks the ESD current I_TS to the ground.

Figure 4:
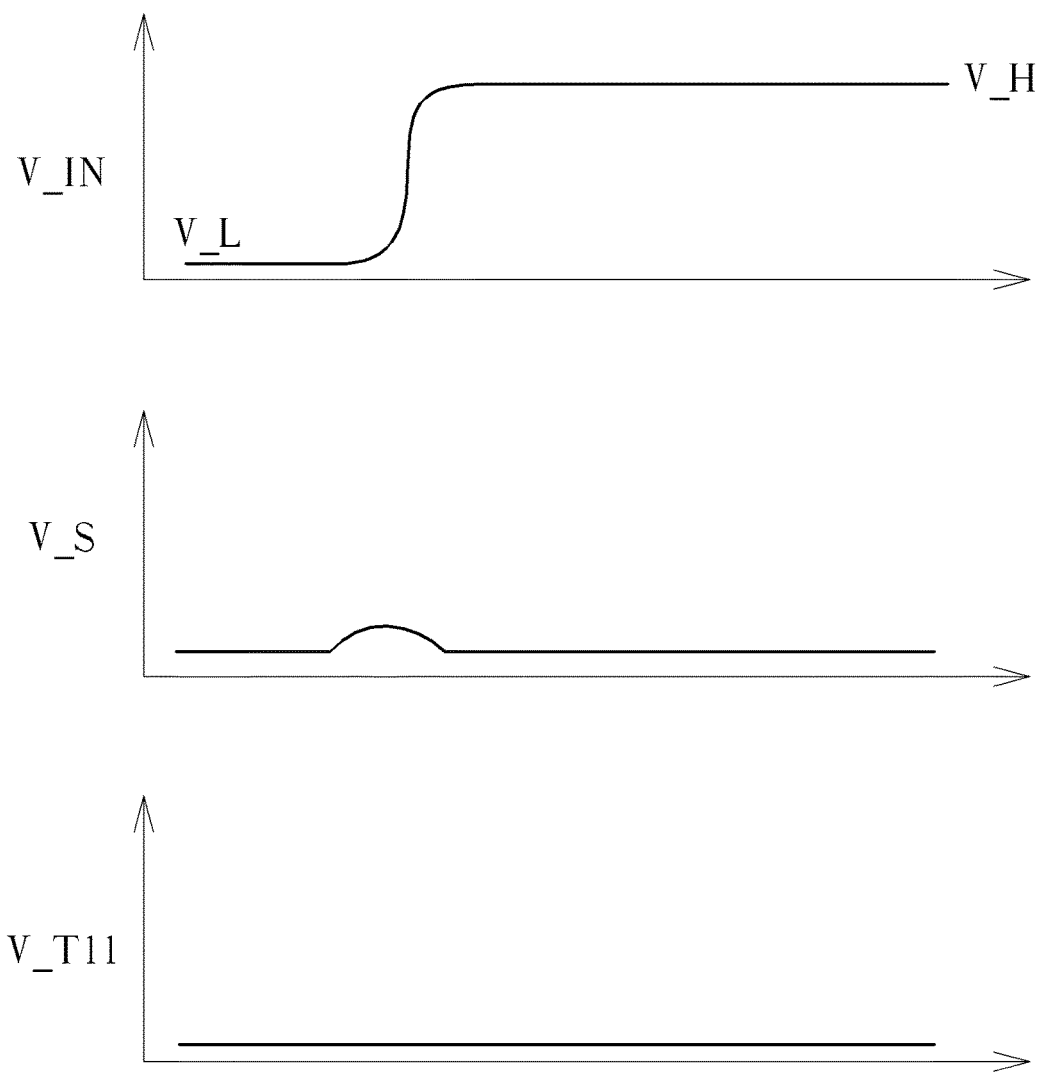

FIG. 4 is another schematic diagram illustrating operations for the voltage generating circuit illustrated in FIG. 2A. In this embodiment, the first switch circuit SC_1 is active and the second switch circuit SC_2 is non-active. Additionally, the output circuit OS is also non-active. Besides, the first transistor of first type T_11 may receive the input voltage V_IN from other sources, which transits from a low voltage V_L to a high voltage V_H. The switch voltage V_S may raise up due to the input voltage V_IN, but is immediately pulled down to zero since the first switch circuit SC_1 is active and the second transistor of first type T_12 leaks current to the ground. Therefore, the first transistor of first type T_11 can be completely turnoff and no leakage current exists.

If the first switch circuit SC_1 is removed, the switch voltage V_S cannot be pulled down after raised up by the input voltage V_IN. Therefore, the existence of the first switch circuit SC_1 can prevent the first transistor of first type T_11 from generating leakage currents.

Figure 5:
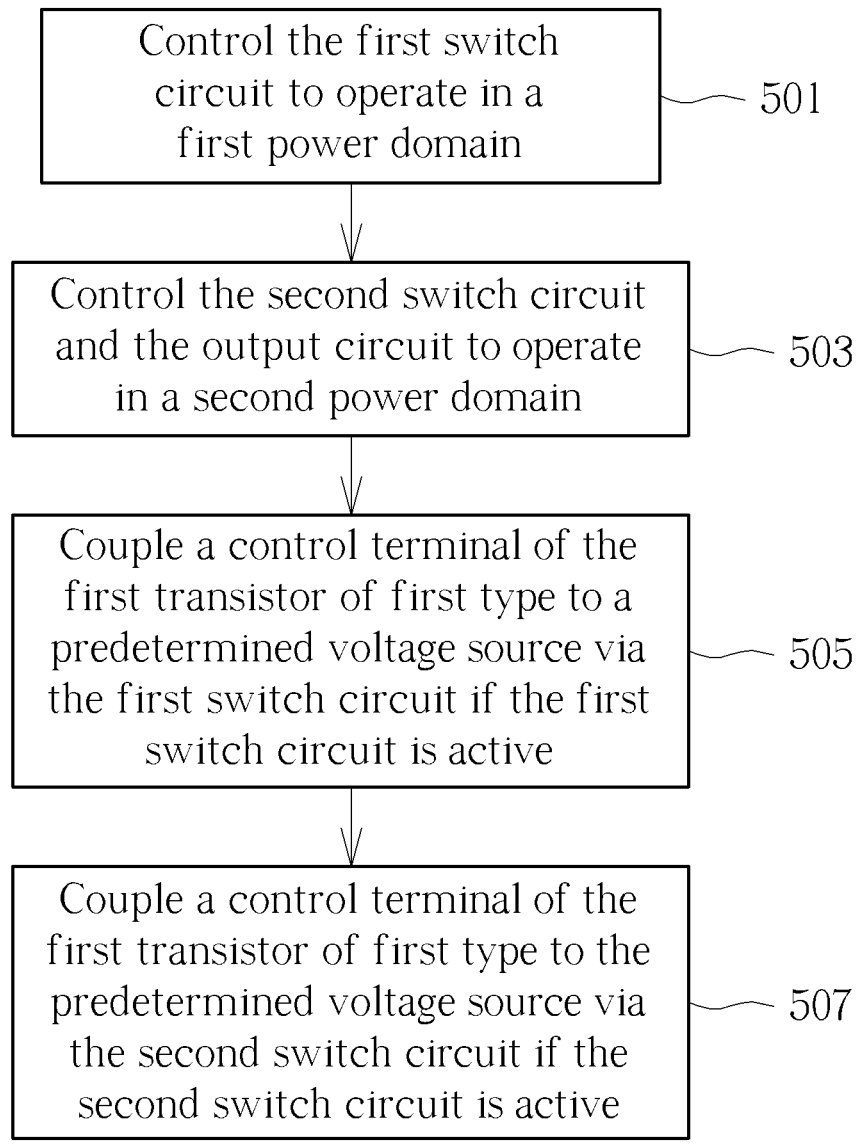
FIG. 5 is a flow chart illustrating a ESD protecting method according to one embodiment of the present application.

In view of above-mentioned embodiments, an ESD protecting method can be acquired. The ESD protecting method is applied to a voltage generating circuit (ex. 100 in FIG. 1) comprising a first switch circuit, a second switch circuit, a first transistor of first type and an output circuit. The first switch circuit and the second switch circuit operate in different power domains. The ESD protecting method is applied in FIG. 5, which comprises:

Step 501

Control the first switch circuit to operate in a first power domain.

Step 503

Control the second switch circuit and the output circuit to operate in a second power domain.

Step 505

Couple a control terminal of the first transistor of first type to a predetermined voltage source via the first switch circuit if the first switch circuit is active.

Step 507

Couple a control terminal of the first transistor of first type to the predetermined voltage source via the second switch circuit if the second switch circuit is active.

In view of above-mentioned embodiments, the issue of leakage currents can be avoided since switch circuits applying two different power domains are provided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage generating circuit, comprising:
    a first switch circuit, coupled between a first supply voltage source and a predetermined voltage source;
    a second switch circuit, coupled between a second supply voltage source and the predetermined voltage source;
    a first transistor of first type, comprising a control terminal coupled to the first switch circuit and the second switch circuit, wherein the control terminal of the first transistor of first type is coupled to the predetermined voltage source via the first switch circuit if the first switch circuit is active, and the control terminal of the first transistor of first type is coupled to the predetermined voltage source via the second switch circuit if the second switch circuit is active; and
    an output circuit, coupled between the second supply voltage source and the predetermined voltage source, and coupled to the first transistor of first type;
    wherein the first switch circuit comprises:
    a first transistor of second type, comprising: a first terminal coupled to the first supply voltage source, a control terminal, and a second terminal coupled to the control terminal of the first transistor of second type; and
    a second transistor of first type, comprising a first terminal coupled to the control terminal of the first transistor of first type, a second terminal coupled to the predetermined voltage source, and a control terminal coupled to the second terminal of the first transistor of second type.

2. The voltage generating circuit of claim 1, wherein if one of the first switch circuit and the second switch circuit is active, the other one of the first switch circuit and the second switch circuit is non-active.

3. The voltage generating circuit of claim 1,
    wherein the first transistor of first type is an N type MOSFET;
    wherein a drain terminal of the first transistor of first type is coupled to the output circuit, a source terminal of the first transistor of first type is coupled to the predetermined voltage source, and the control terminal of the first transistor of first type is a gate terminal.

4. The voltage generating circuit of claim 1,
    wherein the first transistor of second type is a P type MOSFET;
    wherein the first terminal of the first transistor of second type is a source terminal, the second terminal of the first transistor of second type is a drain terminal, and the control terminal of the first transistor of second type is a gate terminal;
    wherein the second transistor of first type is a N type MOSFET;
    wherein the second terminal of the first transistor of first type is a drain terminal, the second terminal of the second transistor of first type is a source terminal, and the control terminal of the second transistor of first type is a gate terminal.

5. The voltage generating circuit of claim 1, wherein the output circuit comprises:
    a second transistor of second type, comprising: a first terminal coupled to the second supply voltage source, a control terminal coupled to the first transistor of first type, and a second terminal; and
    a third transistor of first type, comprising a first terminal coupled to the second terminal of the second transistor of second type, a second terminal coupled to the predetermined voltage source, and a control terminal coupled to the first transistor of first type.

6. The voltage generating circuit of claim 5,
    wherein the second transistor of second type is a P type MOSFET;
    wherein the first terminal of the second transistor of second type is a source terminal, the second terminal of the second transistor of second type is a drain terminal, and the control terminal of the second transistor of second type is a gate terminal;
    wherein the third transistor of first type is a N type MOSFET;
    wherein the second terminal of the third transistor of first type is a drain terminal, the second terminal of the third transistor of first type is a source terminal, and the control terminal of the third transistor of first type is a gate terminal.

7. The voltage generating circuit of claim 1, wherein the voltage generating circuit is a level shifter.

8. A voltage generating circuit, comprising:
a first switch circuit, operating in a first power domain;
a second switch circuit, operating in a second power domain;
a first transistor of first type, comprising a control terminal coupled to the first switch circuit and the second switch circuit, wherein the control terminal of the first transistor of first type is coupled to a predetermined voltage source via the first switch circuit if the first switch circuit is active, wherein the control terminal of the first transistor of first type is coupled to the predetermined voltage source via the second switch circuit if the second switch circuit is active; and
an output circuit, coupled to the first transistor of first type and operating in the second power domain;
wherein the first switch circuit comprises:
a first transistor of second type, comprising: a control terminal, and a second terminal coupled to the control terminal; and
a second transistor of first type, comprising a first terminal coupled to the control terminal of the first transistor of first type and a control terminal coupled to the second terminal of the first transistor of second type.

9. The voltage generating circuit of claim 8, wherein if one of the first switch circuit and the second switch circuit is active, the other one of the first switch circuit and the second switch circuit is non-active.

10. The voltage generating circuit of claim 8, wherein the first transistor of first type is an N type MOSFET.

11. The voltage generating circuit of claim 8, wherein the first transistor of second type is a P type MOSFET and the second transistor of first type is a N type MOSFET.

12. The voltage generating circuit of claim 8, wherein the output circuit comprises:
a second transistor of second type, comprising a control terminal coupled to the first transistor of first type; and
a third transistor of first type, coupled to the second transistor of second type and comprising a control terminal coupled to the first transistor of first type.

13. The voltage generating circuit of claim 12, wherein the second transistor of second type is a P type MOSFET and the third transistor of first type is a N type MOSFET.

14. The voltage generating circuit of claim 8, wherein the voltage generating circuit is a level shifter.

* * * * *